United States Patent [19]

Ishida

[11] Patent Number: 4,499,807
[45] Date of Patent: Feb. 19, 1985

[54] KEY DATA ENTRY SYSTEM FOR AN ELECTRONIC MUSICAL INSTRUMENT

[75] Inventor: Hideaki Ishida, Tokyo, Japan

[73] Assignee: Casio Computer Co., Ltd., Tokyo, Japan

[21] Appl. No.: 516,421

[22] Filed: Jul. 22, 1983

Related U.S. Application Data

[63] Continuation of Ser. No. 297,790, Aug. 31, 1981, abandoned.

[30] Foreign Application Priority Data

Sep. 5, 1980 [JP] Japan .............................. 55-123323
Sep. 5, 1980 [JP] Japan .............................. 55-123324

[51] Int. Cl.³ .............................................. G10F 1/00
[52] U.S. Cl. .............................. 84/1.03; 84/DIG. 22; 84/DIG. 2
[58] Field of Search ...................... 84/1.01, 1.03, 1.17, 84/1.24, DIG. 22, DIG. 2

[56] References Cited

U.S. PATENT DOCUMENTS

| | | | |
|---|---|---|---|
| 4,028,560 | 6/1977 | Bainter | 340/365 E |
| 4,117,758 | 10/1978 | Osburn et al. | 340/365 E |
| 4,185,210 | 1/1980 | Zuk | 340/365 E |
| 4,232,581 | 11/1980 | Uchiyama | 84/DIG. 22 |
| 4,282,786 | 8/1981 | Deutsch et al. | 84/1.01 |

FOREIGN PATENT DOCUMENTS

| | | |
|---|---|---|
| 35636 | 9/1981 | European Pat. Off. |
| 2362037 | 6/1974 | Fed. Rep. of Germany . |
| 3002128 | 9/1980 | Fed. Rep. of Germany . |
| 1401265 | 7/1975 | United Kingdom . |
| 1420682 | 3/1976 | United Kingdom . |
| 1429411 | 3/1976 | United Kingdom . |
| 1455215 | 11/1976 | United Kingdom . |
| 1480251 | 7/1977 | United Kingdom . |
| 1492371 | 11/1977 | United Kingdom . |
| 1549003 | 7/1979 | United Kingdom . |

*Primary Examiner*—Forester W. Isen
*Attorney, Agent, or Firm*—Frishauf, Holtz, Goodman and Woodward

[57] ABSTRACT

A key data entry system for an electronic musical instrument comprises a keyboard having a plurality of user operable chord specification keys, a detector for detecting the key operation state of the chord specification keys, a first specifying device for specifying a particular one of the operated chord specification keys and a second specifying device for specifying the number of chord specification keys operated at one time. Further provided is a chord designating device which designates the root note and the kind of a chord to be produced as a function of the particular one of the operated chord specification keys and the number of chord specification keys operated at one time. In one implementation, one type of chord is produced when only one chord specification key is operated, a second type of chord is produced when two of the chord specification keys are operated together and a third type of chord is produced when three or more of the chord specification keys are operated together.

16 Claims, 7 Drawing Figures

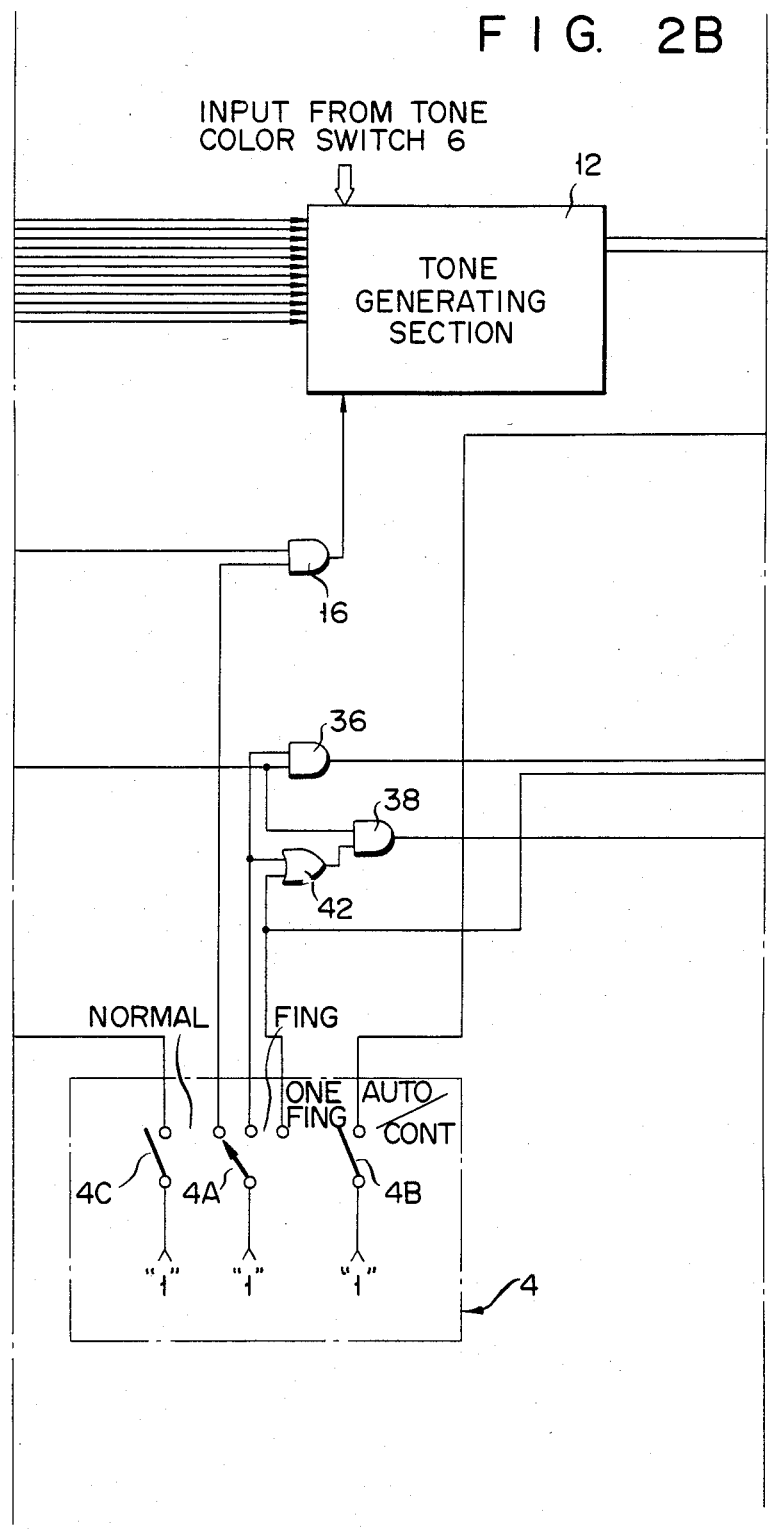

FIG. 4

| NUMBER OF OPERATED KEYS | SORT OF CHORD |
|---|---|
| 1 | MAJOR CHORD (maj) |
| 2 | MINOR CHORD (min) |
| MORE THAN 2 | 7TH CHORD (7th) |

FIG. 5

| CHORD \ RHYTHM | | BEGUINE, RUMBA | OTHERS |
|---|---|---|---|
| MAJOR GROUP | maj, 7th M7, 6th, 9th 7+9 | I - III - V | I - V |
| MINOR GROUP | min, m7 m9 | I - IIIb - V | I - V |
| OTHERS | dim, aug sus4, etc | I - I - I | I - I |

KEY DATA ENTRY SYSTEM FOR AN ELECTRONIC MUSICAL INSTRUMENT

This application is a continuation of application Ser. No. 297,790, filed Aug. 31, 1981, now abandoned.

BACKGROUND OF THE INVENTION

This invention relates to key data entry systems for use in electronic apparatus such as electronic musical instruments.

Electronic keyboard musical instruments such as electronic organs include those in which the accompaniment sound is produced automatically or semi-automatically as the player is performing the melody part of a piece of music so that even beginners can attain the performance of the combination of melody and accompaniment of a musical piece with easy and simple keyboard operation. In some of such musical instruments, chord performance can be obtained by operating performance keys with a single finger. In such musical instruments however, erroneous entry of key data is possible due to key chattering occurring at the time of depressing and releasing keys. To prevent this erroneous entry of signals, it has been proposed to let a key depression signal to be entered immediately when a key is depressed and let a key release signal to be entered a predetermined period of time after the key is released.

In this case, however, extreme inconvenience arises when a certain key is released simultaneously with the depression of a different key. At such a time, it is possible that both the keys are detected to be simultaneously operated, thus causing two different chords to be produced momentarily.

In addition, with such a key data entry system it is difficult to let a chord be specified with the operation of a plurality of keys and let the operated keys be memorized in a memory circuit because strictly speaking the individual keys as the chord specification keys are actually operated at different timings although these keys are apparently operated together. Therefore, it is likely that a chord which is not intended by the operator or player would be produced according to the content of the memory circuit.

SUMMARY OF THE INVENTION

The invention is intended in the light of the above affairs, and its object is to provide a key data entry system which can reliably detect the depression and release of keys that are operated together and reliably prevent erroneous key data entry due to key chattering.

According to the present invention, a key data entry system for an electronic muscial instrument comprises a keyboard including a plurality of user operable chord specification keys; detecting means for detecting the key operation state of the chord specification keys; first means coupled to the detecting means for specifying a particular one of operated chord specification keys; second means coupled to the detecting means for detecting the number of chord specification keys operated at a time; and chord designating means coupled to the first and second means for designating the root note and kind of a chord to be produced as a function of the particular one of the operated chord specification keys and the number of chord specification keys operated at a time.

BRIEF DESCRIPTION OF THE DRAWINGS

FIGS. 2A, 2B and 2C together form a block diagram showing an embodiment of the key data entry system according to the invention;

FIG. 4 is a table showing a one-to-one correspondence between the numbers of keys operated together in a one-finger mode of the illustrated instrument and the kinds of chords; and FIG. 5 is a table showing bass sounds that are provided in accordance with various chords and rhythms.

DETAILED DESCRIPTION OF THE PREFERRED EMBODMIENT

Figure 1:
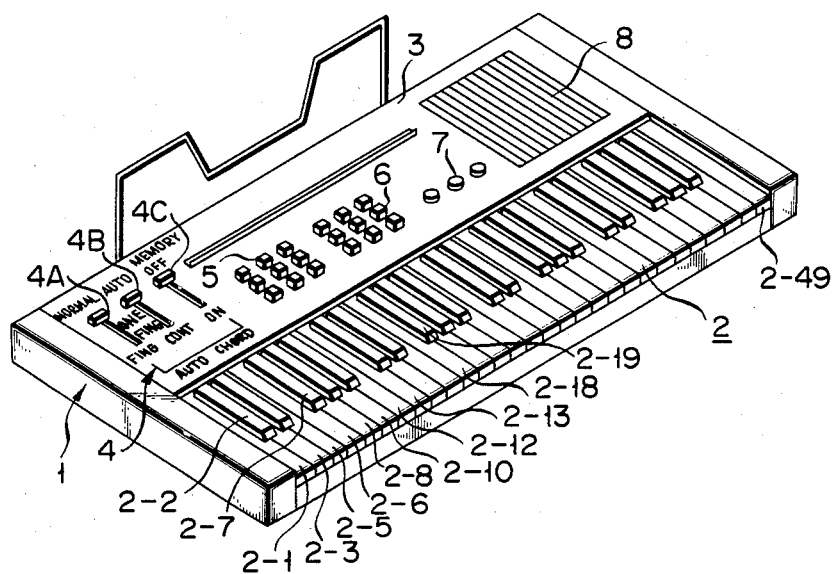
FIG. 1 is a perspective view showing an electronic musical instrument embodying invention.

Now, an embodiment of the invention applied to an electronic organ having an automatic accompaniment sound producing function will be described. FIG. 1 shows a perspective view of the embodiment of the electronic organ. The electronic organ comprises a case 1, the top of which has a keyboard 2 provided at the front and an operation panel 3 provided on the side of the keyboard opposite the player, and which accommodates electronic parts such as LSIs forming a circuit as shown in FIG. 2. The keyboard 2 has forty-nine keys 2-1 to 2-49 for C1 to C5. Of these keys, eighteen keys 2-1 to 2-18 for C1 to F2 are used as chord specification keys for producing automatic accompaniment chords in a one-finger chord and a finger chord.

The operation panel 3 has an auto-chord switch section 4, a rhythm switch section 5, a tone color switch section 6, a volume control switch 7 and a loudspeaker 8. In the auto-chord switch section 4, a mode selection switch 4A, a rhythm mode selection switch 4B and a memory switch 4C are provided. The mode selection switch 4C has three switch positions "NORMAL", "ONE-FING" and "FING". The switch position "NORMAL" specifies a normal mode, in which tones of a tone color specified by the tone color switch section 6 are generated by operating the keys on the keyboard 2. The switch position "ONE-FING" specifies a one-finger mode, in which automatic accompaniment chords are produced together with their bass with the operation of a key among the keys 2-1 to 2-18 for C1 to F2. In this embodiment, different chords are generated in the one-finger mode depending upon whether a single, two or three or more keys are operated at a time among the keys for C1 to F2 mentioned above. More particularly, with the operation of a single key, a major chord with the tone of the operated key as the bass sound is generated. With the operation of two keys at a time, a minor chord with the lower one of the two tones as bass is generated. With the operation of three or more keys at a time, a seventh chord with the lowest tone as bass is generated. The switch position "FING" specifies a finger mode, in which chords are generated together with bass sounds by operating a plurality of keys among the keys for C1 to F2.

The rhythm mode selection switch 4B has two switch positions "AUTO" and "CONT". The switch position "AUTO" specifies an automatic rhythm accompaniment mode, in which chords specified by keys among the keys 2-1 to 2-18 for C1 to F2 in the one-finger mode or finger mode mentioned above are generated together with the bass tones of those chords in a specified rhythm pattern during the key operation. The switch position "CONT" specifies a continuity mode, in which the chords specified by keys among the keys 2-1 to 2-18 for C1 to F2 in the one-finger mode or finger mode are continuously generated together with the bass tones of those chords during the key operation.

The memory switch 4C has two positions "OFF" and "ON". With the memory switch 4C set in the position "ON", once a chord is specified by some of the keys 2-1 to 2-18 for C1 to F2 in the one-finger mode or finger mode, the specified chord and the bass tone of that chord are memorized and are continually generated even after the operated keys are released. With the memory switch 4C set in the position "OFF", the generation of the aforementioned specified chord and bass tone thereof is stopped upon release of the operated key or keys.

The rhythm switch section 5 has switches for specifying various rhythms such as march, waltz, rock, beguine, etc. The tone color switch section 6 has switches for specifying tone colors of various musical instruments such as those of guitar, cello, flute, etc. The tone color section may adopt various systems such as a drawbar system and doublet system.

Figure 2A:
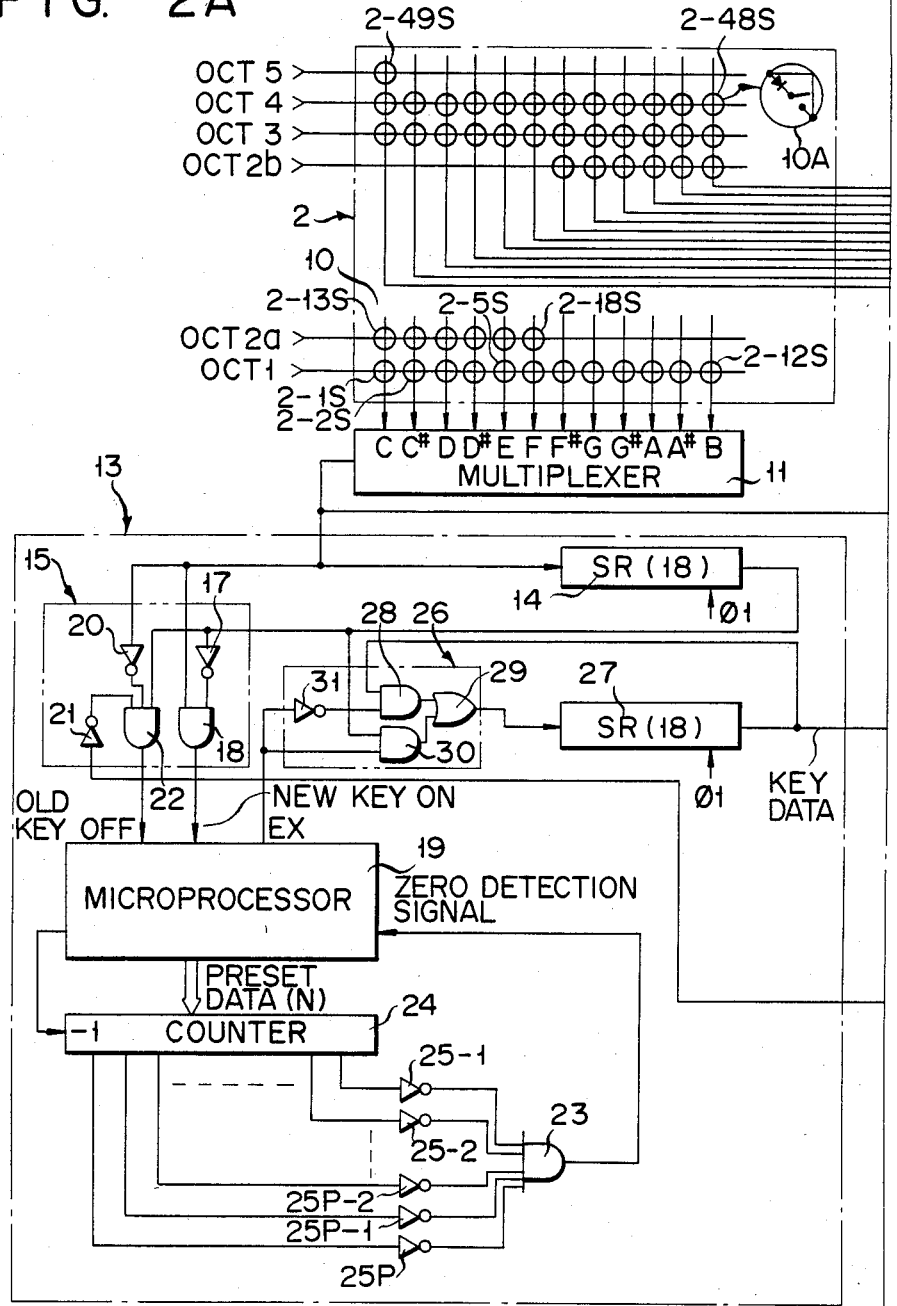
Figure 2C:
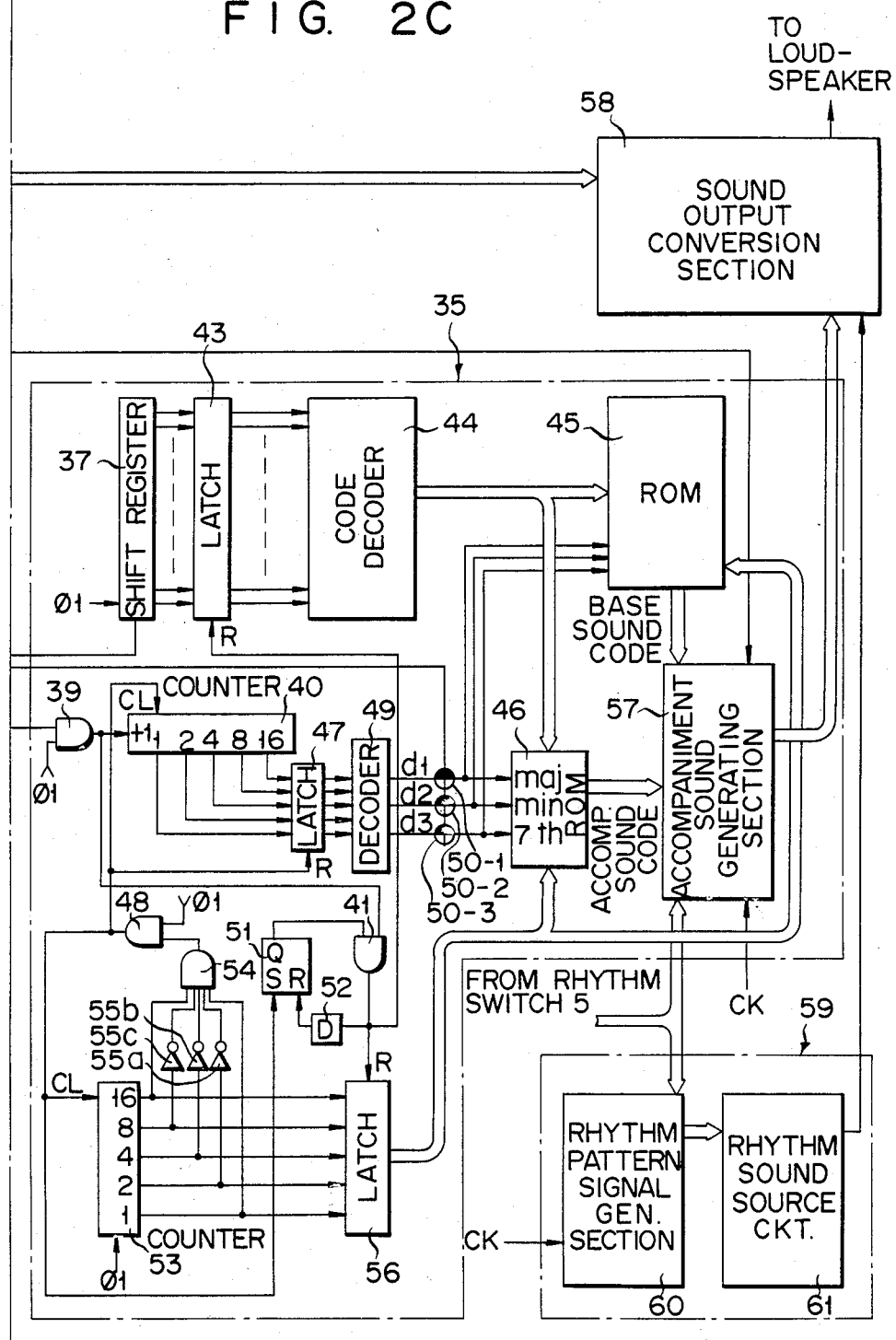

Now, the circuit construction will be described with reference to FIGS. 2A, 2B and 2C. The forty-nine key switches 2-1S to 2-49S for the respective keys 2-1 to 2-49 of the keyboard 2 are arrayed in the form of a matrix 10 with five rows and twelve columns. Here, the rows OCT1, OCT2a and OCT2b, OCT3, OCT4 and OCT5 are respectively for the first to fifth octaves, and C, C#, D, D#, E, F, F#, G, G#, A, A# and B show respective tones in each row. The key switches 2-1S to 2-49S for the keys 2-1 to 2-49 are each connected at the intersection between each row and each column in the form as shown at circle 10A in the Figure; here the key switch 2-48S is shown as an example. The row for the second octave consists of two row lines OCT2a and OCT2b. This arrangement is adopted in order to permit the eighteen keys 2-1 to 2-18 for the first octave row line OCT1 and the second octave first half row line OCT2a to be used as chord specification keys in the one-finger mode and finger mode as mentioned earlier. A key scanning or sampling signal which is periodically provided for each sampling cycle from a control section (not shown) is supplied to the individual row lines OCT1, OCT2a, OCT2b, OCT3, OCT4 and OCT5. The row lines OCT1 and OCT2a, to which the key sampling signal is supplied, supply 12-bit parallel data (key sampling data) to a multiplexer 11, while the row lines OCT2b, OCT3, OCT4 and OCT5 supply 12-bit parallel data (key sampling data) to a tone generating section 12. Each 12-bit parallel data represents the operation state of 12 keys for each octave, for instance keys 2-1 to 2-12. When each bit of the 12-bit parallel data is a binary logic level "1", it indicates that the corresponding key is being operated. When it is a level "0", it indicates that the key is not operated. The bits at the positions of the row line OCT2a where no key switch is provided are of course always "0".

The 12-bit parallel data input to the multiplexer 11 is converted to corresponding serial data. These serial data are supplied successively from lower tone key data, for instance in the order of data of key switches 2-1S, 2-2S, ... in the first octave row line OCT1, to a shift register 14 and a new key-on/old key-off detecting circuit 15 in a key data generating section 13 and also to an AND gate 16. The shift register 14 is an 18-bit register driven by a clock ∅1. The new key-on/old key-off detecting circuit 15 detects depression and release of keys. To this end, it includes an AND gate 18, which receives the output of the multiplexer 11 and a signal of an inverter 17 inverting the output of the shift register 14. The output of the AND gate 18 is provided as a NEW KEY-ON signal to a microprocessor 19. The new key-on/old key-off detecting circuit 15 also includes an AND gate 22, which receives a signal from an inverter 20 inverting the output of the multiplexer 11, and a signal from an inverter 21 inverting the output of the memory switch 4C mentioned above. The output of the AND gate 22 is provided as an OLD KEY-OFF signal to the microprocessor 19.

The AND gate 16 is gate controlled by the output from a switch position NORMAL terminal of the mode selection switch 4A mentioned above, and its output is provided to the tone generating section 12. More particularly, in the aforementioned normal mode, the output data of the multiplexer 11, representing the operation state of the 18 keys 2-1 to 2-18 on the row lines OCT1 and OCT2a, is coupled through the AND gate 16 to the tone generating section 12.

Figure 3:
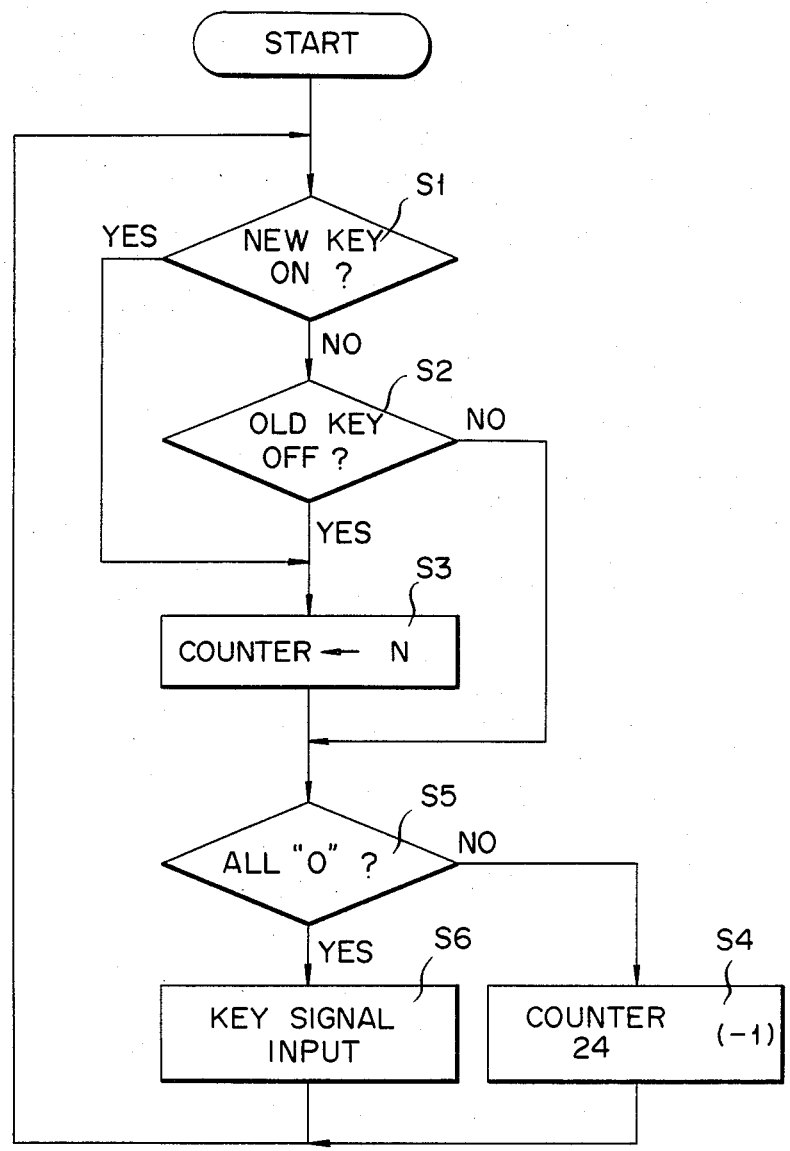
FIG. 3 is a flow chart useful to explain the operation of a key data generating section shown in FIG. 2.

The microprocessor 19 receives the NEW KEY-ON and OLD KEY-OFF signals mentioned above and also the output of an AND gate 23 to be described later in detail, and controls a process of key operation state detection as illustrated in the flow chart of FIG. 3. When it detects NEW KEY-ON and OLD KEY-OFF signals supplied to it (steps S1 and S2 in FIG. 3), the microprocessor 19 provides a preset data N and causes this data N to be set in the counter 24 (step S3). Subsequently, every time the routine shown in the flow chart of FIG. 3 is executed once, the microprocessor 19 provides a "−1" signal to a "−1" input terminal of the counter 24 to decrement the content of the counter 24 by 1 (step S4). The individual bit outputs of the counter 24 are supplied through respective inverters 25-1, 25-2, ..., 25-p to the aforementioned AND gate 23. Thus, when the content of the counter 24 becomes zero (step S4), the output of the AND gate 23 is supplied as zero detection signal of "1" to the microprocessor 19. When it receives the zero detection signal of "1", the microprocessor 19 generates a gate switching signal EX which is supplied to an input gate group 26 (step S6).

The input gate group 26 is provided for a shift register 27, which serves to control the holding and renewal of this key data. The shift register 27 is an 18-bit register driven by the clock ∅1. The output of the shift register 27 is normally held in a circulating circuit formed by an AND gate 28, an OR gate 29 and the shift register 27. When the zero detection signal of "1" is provided upon detection of the zero content of the counter 24, the signal EX goes to "1". This "1" signal is coupled through an AND gate 30 and the OR gate 29 to the shift register 27 to cause renewal of the key data in the shift register 27. The AND gate 28 is gate controlled by a signal from an inverter 31 inverting the gate switching signal EX, and the AND gate 30 is directly gate-controlled by the gate switching signal EX.

Thus, in the key data generating section 13, the preset data N is set in the counter 24 every time a key is depressed and released, subsequently the content of the counter 24 is decremented by 1 after another, and as soon as the content becomes zero the gate switching signal EX of "1" is provided to renew the key data in the shift register 27. Thus, by setting the preset data N to an optimum value, it is possible to reliably eliminate the effects of chattering accompanying the depression and release of keys and let accurate key data be stored as data representing the state of eighteen keys 2-1 to 2-18 for C1 to F2 in the shift register 27. Also, by permitting the preset data N to be renewed in the counter 24 whenever a key is depressed or released, it is possible to reliably detect the state of individual keys when a plurality of keys are depressed together and then load the key data into the shift register 27. On the other hand, when a plurality of keys are released together, the key data can be loaded into the shift register 27 after reliably detecting the release of the keys.

Now, the construction of an automatic accompaniment control section 35 will be described in detail. The aforementioned key data is coupled through an AND gate 36 to a shift register 37, and is also coupled through AND gates 38 and 39 to a "+1" input terminal of a counter 40 and also to an AND gate 41. The AND gate 36 is gate-controlled by the output of a switch position FING terminal of the mode selection switch 4A. Thus, in the finger mode mentioned above, the key data is coupled through the AND gate 36 to the shift register 37. The AND gate 38 is gate-controlled by the output of an OR gate 42, which receives the outputs from switch position FING and ONE-FING terminals of the mode selection switch 4A. The AND gate 39 also receives the clock $\emptyset 1$. Thus, every time data of "1", representing the depressed state of key, among the aforementioned key data is provided from the AND gate 39 in the finger mode or one-finger mode, that data is counted by the counter 40, and it is also supplied to the AND gate 41.

The shift register 37 is an 18-bit counter, and is driven by the clock $\emptyset 1$ to receive and store the key data in the finger mode. The 18-bit parallel data from the individual bits of the shift register 37 are supplied to a latch 43, which receives at its instruction input terminal R the output of the AND gate 41. Thus, the latch 43 latches the aforementioned 18-bit parallel data at the output timing of the "1" signal for the lowest bit, i.e., signal representing the lowest tone, among the "1" signals in the key data loaded into the shift register 27, and provides the latched data to a chord decoder 44.

The chord decoder 44 decodes the 18-bit parallel data provided at the aforementioned output timing of the lowest tone signal and generates various chord signals specifying chords of various kinds such as major (maj), minor (min), seventh (7th) and diminish (dim) in accordance with the key depression pattern. These chord signals are supplied to converting circuits 45 and 46, which are constituted by respective read only memories (ROM).

The counter 40 counts "1" signals in the key data produced from the AND gate 39, and at the same time it counts keys that are simultaneously depressed. Its individual bit outputs (numerals 1, 2, 4, 8 and 16 thereof representing their weighting) are supplied to a latch 47. When a signal produced from an AND gate 48 is coupled to its read instruction input terminal R at the timing of the end of the key sampling operation, the latch 47 latches the aforementioned bit outputs and couples them to a decoder 49. The decoder 49 decodes the latched data and checks whether one, two or three or more keys are depressed. If it detects that only one key is depressed, it provides a "1" signal from its output terminal d1. If two keys are depressed at one time, it provides a "1" signal from its output terminal d2. If three or more keys are depressed at one time, a "1" signal is provided from its output terminal d3. The outputs from the output terminals d1, d2 and d3 of the decoder 49 are supplied through respective transfer gates 50-1, 50-2 and 50-3 to the converting circuit 45, and also they are supplied to respective input terminals (maj), (min) and (7th) of the converting circuit 46. The converting circuits 45 and 46 may be constructed by ROMs. The transfer gates 50-1 to 50-3 are gate-controlled by the output from a switch position ONE-FING terminal of the mode selection switch 4A.

The AND gate 41 mentioned above is gate-controlled by the set output of an S-R flip-flop 51, and its output is supplied through a delay circuit 52 which provides a delay time for one bit to the reset input terminal R of the flip-flop 51. An octadecimal counter 53 driven by the clock $\emptyset 1$ is further provided in the automatic accompaniment control section 36. The counting operation of the octadecimal counter 53 is synchronized to the key sampling operation of the key switch matrix 10, and the outputs of the counter 53 with respective weighting values of 1 and 16 are directly supplied to an AND gate 54. The other bit outputs of the counter with the weighting values of 2, 4 and 8 are supplied through respective inverters 55a, 55b and 55c to the AND gate 54. Thus, a "1" signal is provided from the AND gate 54 to the AND gate 48 every time the count of the octadecimal counter 53 becomes 17 (corresponding to a binary expression of 10001), i.e., at the end of each counting cycle period (18-bit time) of the octadecimal counter 53. The AND gate 48 receives the clock $\emptyset 1$, and its output is supplied to the clear input terminals CL of the counters 40 and 53, the read instruction input terminal R of the latch 47 and to the set input terminal S of the flip-flop 51. The outputs of the octadecimal counter 53 are supplied together to the latch counter 56. The output of the AND gate 41 is supplied to the read instruction input terminal R of the latch 56.

With the above construction, at the end of each counting cycle of the octadecimal counter 53 the bit outputs of the counter 40 are latched in the counter 40 first, and then the flip-flop 51 is reset in the counters 40 and 53 while the flip-flop 51 is set. The flip-flop 51 is reset one bit period after the appearance of the "1" signal representing the low tone key depression signal in the key data from the AND gate 41. The AND gate 41 is thus subsequently disabled at the end of each counting cycle. Thus, only the data in the shift register 37 or the count data of the octadecimal counter 53 is latched in the latch 43 or 56 at the timing for the lowest tone "1" signal among the "1" signals in the key data. The count data latched in the latch 56 is supplied to the converting circuits or ROMs 45 and 46. Since this count data is that for the lowest tone, provided from the octadecimal counter 53 mentioned above, it serves as the bass sound data for the simultaneously depressed keys at that time. This count data is used as an address signal for the ROM constituting the converting circuit 46. With the outputs of the chord decoder 44, decoder 49 and latch 56 as address signals, the converting circuit 45, constituted by the ROM, reads out base sound codes and supplies them to an accompaniment sound generating section 57 in conformity to a condition as shown in FIG. 5. In the formation of the bass sound codes, the output data (or codes) from the chord decoder 44 are first sorted in the converting circuit 45 into major, minor and other chords, and these chords are then sorted depending upon rhythms such as beguine, rumba, etc. The converting circuit 45 provides different outputs for these various chords. In FIG. 5, labeled I, III and V are the first, third and fifth sounds respectively.

The converting circuit 46 reads out accompaniment chord data among various data supplied from the chord decoder 44 in accordance with the input signals to the input terminals (maj), (min) and (7th) and the data from the latch 56 and supplies the read-out data to the accompaniment sound generating section 57. To the accompaniment sound generating section 57, the data from the rhythm switch section 5 and the output from the rhythm mode selection switch 4B are further supplied. The accompaniment sound generating section 57 is driven by a clock CK to generate accompaniment chord data, bass sound data and data from the rhythm switch section 5 and rhythm mode selection switch 4B and supply the generated data to a sound output conversion section 58.

Meanwhile, data from the tone color switch section 6 is supplied to the tone generating section 12, which generates tone data by providing specified tone color data to individual data supplied as key sampling data and supplies these data to the sound output conversion section 58.

The data from the rhythm switch section 5 is further supplied to a rhythm pattern generating section 60 in a rhythm sound generating section 59. From the rhythm pattern signal generating section 60 a rhythm pattern signal for a rhythm specified by a rhythm pattern switch 5 is generated and supplied to a rhythm sound source circuit 61. The rhythm sound source circuit 61 includes sound source circuits for various rhythms, and the rhythm pattern signal mentioned above is coupled to a corresponding rhythm source circuit, whereby a corresponding rhythm signal is provided to the sound output conversion section 58. The sound, output conversion section 58 synthesizes the bass sound data, accompaniment chord data and rhythm signal mentioned above and supplies the resultant signal to a loudspeaker which produces the corresponding music sound.

The rhythm pattern signal generating section 60, like the accompaniment generating section 57, is driven by the clock CK, and the frequency of the clock CK is variable according to the output of the volume switch 7; for instance the clock CK is obtained by supplying the output of the switch 7 to a voltage controlled oscillator.

Now, the operation of the embodiment will be described. First, the case of providing automatic accompaniment sound in the one-finger mode will be explained. This mode is set by setting the mode selection switch 4A in the switch position "ONE-FING". It is assumed that in this state the memory switch 4C is set in the position "ON" and the rhythm mode selection switch 4B in the position "AUTO". Also, it is assumed that desired switches in the rhythm switch section 5 and tone color switch section 6 are rendered operative and the volume switch 7 is set in a desired position. As an example, a case of providing automatic accompaniment of major chord, for instance, with E as bass sound by operating the key 2-5 for E1 among the keys 2-1 to 2-18 for C1 to F2 during the performance of a piece of music will be taken. With the setting of the mode selection switch 4A in the position "ONE-FING", the AND gate 38 and transfer gates 50-1 to 50-3 are enabled. Also, with the setting "ON" of the switch 4C, the AND gate 22 is enabled.

The operation of the key 2-5 for E1 is detected when the key scanning signal is coupled to the row line OCT1 of the key switch matrix 10, that is, when the key switch 2-5S is turned on. At this time, the 12-bit key sampling data is loaded as parallel data "000010000000" from the key switch matrix 10 into the multiplexer 11. The multiplexer 11 supplies the input parallel data as serial data from the data "0" for C to the shift register 14, new key-on/old key-off detecting circuit 15 and AND gate 16. The shift register 14 successively shifts the sequentially coupled key sampling data. In the new key-on/old key-off detecting circuit 15, the output of the AND gate 18, supplied as NEW KEY-ON signal, to the microprocessor 19, is "1" only while the "1" signal for E1 is being supplied from the multiplexer 11. At this time, the AND gate 22 is off, and its output, i.e., the OLD KEY-OFF signal with respect to the key data mentioned above, is also "0". Further, the output of the AND gate 16 is "0".

When all the data is output from the multiplexer 11 in the above operation, the next row line OCT2a is scanned, the next sampling data "000000000000" are similarly loaded into the multiplexer 11 to be supplied to the shift register 14. Of the output from the row line OCT2a, supplied as the key sampling data, only the data for the bits of lower tone are effective.

Upon receipt of the NEW KEY-ON signal of "1", the microprocessor 19 provides the preset data N which is set in the counter 24 (step S3 in FIG. 3). Subsequently, it supplies "−1" signals to the counter 24 for decrementing the content thereof by 1 after another at a predetermined rate (step S4). During this count-down operation of the counter 24, the key scanning operation is in force in the key switch matrix 10. If chattering of the key 2-6 for E1 is detected during this time, the NEW KEY-ON signal becomes "1" again. As a result, the microprocessor 19 is caused to provide the data N to the counter 24 again.

When the content of the counter 24 becomes zero, the output of the AND gate 23, i.e., the zero detection signal supplied to the microprocessor 19, becomes "1". The microprocessor 19 supplies this "1" signal as the gate switching signal EX to the input gate group 26 during the 18-bit period. During this period, the AND gate 30 is held enabled while the AND gate 28 is held disabled. Thus, the key sampling data is transferred from the shift register 14 through the AND gate 30 and OR gate 29 to the shift register 37 (step S6). When the key sampling data (for 18 bits) have all been supplied to the shift register 27, the gate switching signal EX becomes "0" to enable the AND gate 28 and disable the AND gate 30. As a result, the key sampling data supplied to the shift register 27 is held circulated in the circulating circuit constituted by the shift register 27, AND gate 28 and OR gate 29 until the commencement of transfer of new sampling data to the shift register 27. The key data stored in the shift register 27 has been transferred from the shift register 14 after the completion of the count-down operation thereof. Thus, this data is accurate and perfectly free from errors due to key chattering at the time of the depression of the key 2-5 for E1.

This key data in the shift register 27 is then supplied through the AND gates 38 and 39 to the counter 40 and AND gate 41. At the instant when its transfer to the shift register 27 is completed, the key data is "000000000000010000". Thus, when the count of the octadecimal counter 53 becomes 4, the "1" signal in the key data corresponding to the tone E1, is provided through the AND gate 39 to the counter 40. With this signal supplied the content of the counter 40 is changed to 1 at the timing of appearance of the next clock signal ⌀1. At this time, the output of the AND gate 41 becomes "1", causing the count of 4 of the octadecimal counter 53 to be latched in the latch 56. Also, after the lapse of one bit time the flip-flop 51 is reset. Subsequently, no "1" signal is provided from the AND gate 39, and hence the count of the octadecimal counter 40 remains 1, until the count of the octadecimal counter 53 becomes 17. When the count of the octadecimal counter 53 becomes 17, the output of the AND gate 54 becomes "1", causing a single pulse to be provided from the AND gate 48 in synchronism to the clock ⌀1. By this pulse, the count value of 1 in the counter 40 is latched in the latch 47, and the counters 40 and 53 are cleared. Further, the flip-flop 51 is set to enable the AND gate 41 again.

The count value of 1 latched in the latch 47 is decoded in the decoder 49, which thus provides a "1" signal only at its output terminal d1. This "1" signal is supplied through the transfer gate 50-1 in the enabled state to the converting circuit 45 and also to the input terminal (maj) of the converting circuit 46. Meanwhile, the count 4 that has been latched in the latch 56 is supplied to the converting circuits 45 and 46. The converting circuit 45 generates the bass sound data I-III-V when (beguine or rumba is selected in the rhythm switch section 5) or I-V (when a rhythm other than beguine and rumba is selected) according to the output of the decoder 49 and the count 4 in the major system of the converting circuit 45 and supplies it to the accompaniment sound generating section 57. The converting circuit 46 generates an accompaniment chord data based upon a major chord (maj) with the tone E as the root according to the signal supplied to the input terminal (maj) and count 4 from the latch 56 in conformity to the table of FIG. 4 and supplies it to the accompaniment sound generating section 57. The accompaniment sound generating section 57, which receives the accompaniment chord data, bass sound data and rhythm data from the rhythm switch section 5, generates accompaniment sound data in conformity to the specified rhythm and supplies it to the sound output conversion section 58.

Since the tone data of the melody part of the music piece performed using the keys 2-19 to 2-49 for F2# to C5 is supplied from the tone generating section 12 to the sound output conversion section 58, the melody is produced together with the accompaniment sound which is produced according to the accompaniment data mentioned above from the loudspeaker. Since at this time the memory switch 4C is set "ON", the output of the AND gate 22 as the OLD KEY-OFF signal remains inhibited at the time of the release of the key 2-5 for E1. Thus, the accompaniment chord data is continually provided for continual production of the accompaniment after the release of the key 2-5.

When the memory switch 4C is set "OFF", with the rhythm selection switch 4B set in the switch position "AUTO" the accompaniment data mentioned above is provided to effect automatic rhythm accompaniment in synchronism with the specified rhythm while the key 2-5 is depressed. With the rhythm selection switch 4B in the switch position "CONT", the accompaniment data is provided for automatic rhythm accompaniment independently of any specified rhythm while the key 2-5 is depressed.

Now, the case of providing automatic accompaniment in a minor chord with the operation of two keys at a time will be described. In this case, if the tone E is made the root as in the above case, the second key may be any key for a tone higher than E1 (but up to F2), for instance the key for F1, and it is operated together with the key for E1. While in this case two keys such as the keys 2-5 for E1 and 2-6 for F1 are operated at one time, in a strict sense these keys are electrically not simultaneously depressed. It is now assumed that electrically the key 2-6 for F1 is depressed first. In this case, in the scanning of the line OCT1 in the key switch matrix 10, a state with the sole key switch 2-6S for F1 "on" is first detected. Thus, key sampling data "000001000000" is first loaded into the multiplexer 11.

As soon as the "1" signal for the tone F1 in the input key sampling data is provided from the multiplexer 11, the NEW KEY-ON signal (of "1") is supplied from the new key-on/old key-off detecting circuit 15 to the microprocessor 19. As a result, the preset data N is set in the counter 24 (step S3), and the counter 24 is caused to start the count-down operation of subtracting 1 after another from the preset data N (step S4). When the key switch 2-5S for the key 2-5 for E1 that is operated together is subsequently turned on and this is detected in the key scanning in the key switch matrix 10, key sampling data "000011000000" is loaded into the multiplexer 11. As soon as the "1" signal for the key 2-5 for E1 in the key data in the multiplexer 11 is provided therefrom, a NEW KEY-ON signal (of "1") is supplied again to the microprocessor 19. Thus, during the count-down operation of the counter 24 that is started with the operation of the key 2-6 for F1, the preset data N is set again in the counter 24 (step S3) to cause the count-down operation thereof to start afresh (step S4). Meanwhile, after the line OCT1 the line OCT2a is scanned, key sampling data "0000000000" is supplied to the multiplexer 11 as mentioned earlier.

When the count of the counter 24 becomes zero, the zero detecting signal (of "1") is supplied from the AND gate 23 to the microprocessor 19, causing the microprocessor 19 to provide the gate switching signal EX (of "1") to cause the transfer of the key data in the shift register 14 to the shift register 27 (step S6). The key data that is transferred to the shift register 27 at this time is "000000000000110000".

This key data is supplied through the AND gates 38 to 39 to the counter 40 and AND gate 41. Also, with the appearance of the "1" signal for the tone E1 from the AND gate 39, i.e., with the change of the count of the octadecimal counter 53 to 4, the count of the counter 40 becomes 1 upon appearance of the next clock pulse ⌀1. Also, with the appearance of the output of "1" from the AND gate 41 the count value of 4 in the octadecimal counter 53 is latched in the latch 56.

Upon appearance of the next "1" signal for the tone F1 from the AND gate 39, the flip-flop 51 is reset by the output (of "1") from the delay circuit 52, thus disabling the AND gate 41. With the output of "1" from the AND gate 39, the content of the counter 40 is incremented by 1 to 2. Meanwhile, since the AND gate 41 is disabled, its output is "0", and the count value of 5 in the octadecimal counter 53 is not latched in the latch 56, but the count value of 4 representing the root for E1 is held in the latch 56.

Subsequently, when the count of the octadecimal counter 53 becomes 17, an output pulse is provided from the AND gate 48 to let the count value of 2 in the counter 40 latched in the latch 47 and then clear the counters 40 and 53 while setting the flip-flop 51. The count value of 4 latched in the latch 56 is supplied to the converting circuits 45 and 46, and the count value of 2 latched in the latch 47 is decoded in the decoder 49. The decoder 49 supplies at this time a "1" signal only from the output terminal d2 through the transfer gate 50-2 to the converting circuits 45 and 46.

The converting circuit 45 thus generates a minor bass sound data I-IIIb-V (b representing the flat of the third tone) when the rhythm is beguine or rumba or I-V when the rhythm is other than beguine or rumba according to the output of the decoder 49 and the count value of 4 in the latch 56 and supplies it to the accompaniment sound generating section 57. Meanwhile, the converting circuit 46 generates an accompaniment chord data for a minor chord with E as the root from the "1" signal to the input terminal (min) and the count value of 4 from the latch 56 and supplies it to the accompaniment sound generating section 57. The accompaniment sound generating section 57 generates accompaniment sound data conforming to the specified rhythm from the accompaniment chord data and bass sound data mentioned above and supplies it to the sound output conversion section 58. Thus, automatic accompaniment sound according to the accompaniment sound data is produced together with the accompanied melody from the loudspeaker.

When one of the keys 2-5 and 2-6 that have been operated together, for instance the key 2-5 for E1, is released with the memory switch 4C in the position "OFF", key sampling data "000001000000" is loaded into the multiplexer 11. At the subsequent instant of appearance of the "1" signal for F1 from the multiplexer 11, the OLD KEY-OFF signal (of "1") is supplied from the new key-on/old key-off detecting circuit 15 to the microprocessor 19. Thus, the preset data N is set in the counter 24 (step S3), causing the count-down operation thereof (step S4). When the count of the counter 24 becomes zero, the zero detection signal (of "1") is provided in the manner as described above, causing the gate switching signal EX (of "1") to be provided to cause the transfer of the key data to the shift register 27 (step S6). Thus, key data "000000000000100000" is obtained. As a result, the same operation as that at the time of the generation of the accompaniment chord data for the major chord with E as the root is executed in the automatic accompaniment control section 35, thus generating the accompaniment data of the major chord with the tone F of the key 2-6 for F1 as the root. Thus, when only the key 2-6 for F1 of the keys 2-5 and 2-6 for F1 and E1 is released, the minor chord (min) with the tone F as the root is switched in the accompaniment over to the major chord (maj) with the tone E as the root at the instant of release of that key.

On the other hand, when the key 2-5 for E1 of the keys for the tones E1 and F1 is released, the same operation as at the time of the release of the key for F1 is effected in the key data generating section 13 to obtain key data "000000000000010000". In accordance with this key data, the accompaniment chord data for the major chord (maj) with the tone F as the root is obtained in the automatic accompaniment section 35. Thus, from the instant of release of the key 2-5 for the tone E1 of the keys 2-5 and 2-6 for E1 and F1 that have been depressed together, the major chord (maj) with the tone F as the root replaces the minor chord (min) with the tone E as the root in the accompaniment.

It is to be understood that the accompaniment is switched from the minor chord (min) over to the major chord (maj) as soon as one of the two keys operated together among the keys 2-1 to 2-18 is released. Also, when one of these keys is released, an OLD KEY-OFF signal with respect to that key is provided to let the preset data N be set in the counter 24 and cause the count-down operation thereof before generation of the new key data as described earlier. Thus, it is possible to reliably prevent the generation of erroneous data due to chattering at the time of the release of key, and accurate key data can be obtained.

Now, the case of providing the accompaniment in seventh with the operation of three or more keys at a time will be described. As an example, a case when three keys are operated with E as the root as in the aforementioned major and minor cases will be taken. The other two tones than the root E may be any tone higher than E1 (but up to F2). Here, they are assumed to be F1 and F1#. Although the three keys 2-5, 2-6 and 2-7 for E1, F1 and F1# are operated together, electrically they are not simultaneously operated as mentioned earlier. As each of these keys is operated, the corresponding key sampling data is loaded into the multiplexer 11. Every time the key sampling data is loaded into it, the multiplexer 11 provides a NEW KEY-ON signal (of "1") for that key to let the preset data N be set in the counter 24 and also cause the count-down operation of the counter 24 (step S4). When the third key is operated, key sampling data "000011100000" is loaded into the multiplexer 11. As this data is transferred to the shift register 27, it is provided as "000000000001110000" therefrom. This key data is supplied through the AND gates 38 and 39 to the counter 40 and AND gate 41. When the "1" signal for E1 is provided from the AND gate 39, i.e., when the count value in the octadecimal counter 53 becomes 4, the count of the counter 40 becomes 1, and the count value of 4 in the octadecimal counter 40 is loaded into the latch 56. Then, immediately before the signal for F1 is provided from the AND gate 39, the flip-flop 51 is reset to disable the AND gate 41.

Then, the count of the counter 40 becomes 2, and upon subsequent appearance of the "1" signal for F1# the count becomes 3. When the count of the octadecimal counter 53 subsequently becomes 17, an output pulse is provided from the AND gate 48 to let the count 3 of the converter be latched in the latch 47 and reset the counters 49 and 53 while setting the flip-flop 51.

The count 3 latched in the latch 47 is decoded in the decoder 49, which thus provides "1" signal only from its output terminal d3. This "1" signal is supplied through the transfer gate 50-3 to the converting circuit 45 and also supplied to the input terminal (7th) of the converting circuit 46. The converting circuit 45 generates a major group bass sound data I-III-V (when the rhythm is beguine or rumba) or I-V (when the rhythm is other than beguine and rumba) according to the output of the decoder 49 and count 4 from the latch 56 in conformity to FIG. 5 and supplies it to the accompaniment sound generating section 57. Meanwhile, the converting circuit 46 generates accompaniment chord data of seventh chord (7th) with E as the root in conformity to FIG. 4 and supplies it to the accompaniment sound generating section 57. The accompaniment sound generating section 57 generates accompaniment sound data in conformity to the specified rhythm according to the accompaniment chord data and bass sound data and supplies it to the sound output conversion section 58 to produce accompaniment sound in accordance with the accompaniment sound data together with melody from the loudspeaker.

With the memory switch 4C set "OFF" in producing the automatic accompaniment in seventh as described, like the case of the automatic accompaniment in minor, with release of one of the aforementioned three keys, the accompaniment is switched over to that in minor chord with the lower one of the tones of the remaining two keys as the root. Also, when two of the three keys are released, the accompaniment is switched to that in major chord with the tone of the remaining key as the root. Further, when four or more keys among the eighteen keys 2-1 to 2-18 for C1 to F2 are operated at a time, automatic accompaniment is seventh with the lowest one of the tones of the operated keys as the root is produced in the manner as described.

Now, the operation in the finger mode will be described. This mode is set by setting the mode selection switch 4A in the switch position "FING". If it is intended to provide, for instance, a major accompaniment chord with C as root, the keys 2-1, 2-5 and 2-8 for C1, E1 and G1 are operated. With the setting of the mode selection switch 4A to the position "FING", the AND gates 36 and 38 are enabled, and the transfer gates 50-1 to 50-3 are disabled. With the three keys 2-1, 2-5 and 2-8 operated at a time, when each of these keys is electrically detected in the key switch matrix 10, a NEW KEY-ON signal is provided to let the preset data N be set in the counter 24 (step S3) as mentioned earlier. Thus, the counter 24 is caused to effect the count-down operation (step S3). When another NEW KEY-ON signal is detected during the count-down operation, the preset data N is set again (step S3), causing the count-down operation afresh (step S4). When the three keys are all detected, key sampling data "100010010000" 1 is loaded in the multiplxer 11. This data is then transferred to the shift register 27 so that the key data therein becomes "000000000010010001". This key data is supplied through the AND gate 36 to the shift register 37 and also supplied through the AND gates 38 and 39 to the counter 40 and AND gate 41. When the "1" signal for C1 among the key data is provided from the AND gate 39, i.e., when the count of the octadecimal counter 53 becomes zero, the count of the counter 40 becomes 1, and the count zero of the octadecimal counter 53 is latched in the latch 56. At the same time, the data in the shift register 37 is latched in the latch 43. The data supplied from the shift register 37 for the first time is made ineffective in the chord detector 44 because all the key data is not supplied yet. After the subsequent lapse of one bit time, the flip-flop 51 is reset by the output of the delay circuit 52 to disable the AND gate 41.

When the count of the octadecimal counter 53 becomes 17, the key data mentioned above is all supplied to the shift register 37. Also, an output pulse is provided from the AND gate 48 to let the count 3 of the counter 40 be latched in the latch 47. Then, the octadecimal counters 40 and 53 are reset, and the flip-flop 51 is set. The latch 47 does not participate in the operation of this case at all insofar as the transfer gates 50-1 to 5-3 are held disabled. Thus, the count of the octadecimal counter 53 becomes zero again, and the first bit of the key data that are held circulated, i.e., the "" signal for C1, is supplied to the shift register 37 again. The AND gate 41 provides output (of "1") at the output timing of the clock pulse ∅1 to let the aforementioned count zero be latched in the latch 56 and the data "1000000000001001000" in the shift register 37 in the latch 43. The data in the latch 43 is decoded in the chord decoder 44, whereby a signal representing the kind of a chord such as (maj), (min), (7th), (dim), etc. (in the instant case a signal specifying the chord (maj)), is supplied to the converting circuits 45 and 46. Meanwhile, the count zero latched in the latch 56 is supplied to the converting circuits 45 and 46. The converting circuit 45 provides a bass sound data I-III-V or I-V in major (Cmaj) to the accompaniment sound generating circuit 57 in conformity to FIG. 5. Meanwhile, the converting circuit 46 provides the accompaniment chord data in Cmaj to the accompaniment generating section 57. Thus, the accompaniment sound generating section generates the accompaniment sound data based on the accompaniment sound data and bass sound data and supplies it to the sound output conversion section 58 for producing accompaniment sound together with melody from the loudspeaker.

When operating the keyboard for performance in the normal mode, the mode selection switch 4A is set to the position "NORMAL". As a result, only the AND gate 16 is enabled, and the AND gates 36 and 38 and transfer gates 50-1 to 50-3 are disabled. Thus, in the normal mode no key data is supplied to the automatic accompaniment control section 35, and this section is held inoperative. In this state, musical sound of tones of any keys among the fourty-nine keys 2-1 to 2-49 on the keyboard 2 can be produced. In this case, the key sampling data for C1 to F2 (2-1 to 2-18) is supplied to the multiplexer 11 and thence through the AND gate 16 to the tone generating section 12. In the musical sound generating section 12, musical sound signals for individual operated keys are generated as for the keys 2-19 to 2-49 for the other tones F2# to C5. These sound signals are supplied to the sound output conversion section 58 for production of corresponding musical sounds from the loudspeaker.

While in the above embodiment automatic accompaniment in major, minor and seventh has been produced in the one-finger mode with the operation of a single key, two keys at one time and three or more keys at one time respectively, it is possible to establish any desired one-to-one correspondence between the numbers of keys operated together and the kinds of chords. For instance, major chord may be specified by a single key, seventh chord by two keys and minor chord by three or more than three keys. Also, while in the above embodiment chords have been generated with the lowest one of the tones of the keys that are operated together as the root, it is also possible to make the highest one of the tones of the keys operated together as the root depending upon the method of key scanning in the key switch matrix 10. Further, the keys for specifying chords are not limited to those for C1 to F2, and generally keys including keys at least for one octave may be made as the specification keys. Further, in the finger mode the key data in the shift register 27 may be supplied in lieu of the output of the converting circuit 46 to the accompaniment generating section 57. In this case, it is necessary to generate bass sound chords from the key data.

While, in the above embodiment key data is converted into serial data by means of the multiplexer 11, the serial data is then supplied to shift register 14 for performing various processes using the serial data thus obtained, it is possible to perform the various processes using parallel data obtained from the keyboard 2. In this case RAM and the like may be useful for storing the key data.

As has been described in the foregoing, according to the invention when a change of the key operation state is detected, the key data is fetched and stored after the lapse of the chattering time, and the given signal is generated in accordance with the stored key data. Thus, it is possible to reliably detect keys that are operated together and prevent erroneous key data entry due to chattering of keys and permit entry and storage of the data of operated keys accurately and with a simple circuit construction.

What is claimed is:

1. A key data entry system for an electronic musical instrument, comprising:
   a keyboard including a plurality of user operable chord specification keys;
   detecting means coupled to said keyboard for detecting the key operation state of said chord specification keys;
   first means coupled to said detecting means for generating a first signal representing, when only one of said chord specification keys is operated, said one operated key as a particular key, and for generating a second signal representing the higher or highest note key as said particular key when plural chord specification keys are operated;
   second means coupled to said detecting means for generating a third signal representing the number of chord specification keys operated at a time by the operator; and
   chord designating means coupled to said first and second means and being responsive to one of said first and second signals for generating a signal representing the root note of a chord to be produced which is a function of said particular key, and being responsive to said third signal for generating a signal representing the type of the chord to be produced as a function of the number of said chord specification keys operated simultaneously, irregardless of which of said plurality of chord specification keys are operated.

2. The key data entry system of claim 1, wherein said chord specification keys exhibit key chattering when operated, and said detecting means includes means for detecting the key operation state of said chord specification keys after the lapse of a predetermined period of time from initial operation of a key, said predetermined period of time being at least as long as the key chattering time of said chord specification keys.

3. The key data entry system of claim 1, wherein said chord designating means generates a signal representing a major chord when only one chord specification key is operated, a minor chord when two chord specification keys are operated together, and a seventh chord when three or more chord specification keys are operated together.

4. The key data entry system of claim 1, wherein said chord designating means generates a signal representing a major chord when only one chord specification key is operated, a seventh chord when two chord specification keys are operated together, and a minor chord when three or more chord specification keys are operated together.

5. The key data entry system of claim 1, wherein said chord designating means generates a signal representing one type of chord when only one chord specification key is operated, and a signal representing a second type of chord when two of said chord specification keys are operated together.

6. The key data entry system of claim 5, wherein said chord designating means generates a signal representing a third type of chord different from said first and second types of chords when three of said chord specification keys are operated together.

7. The key data entry system of claim 5, wherein said first type of chord is a major chord, and said second type of chord is a minor chord.

8. The key data entry system of claim 5, wherein said first type of chord is a major chord, and said second type of chord is a seventh chord.

9. A key data entry system for an electronic musical instrument, comprising:
   a keyboard including a plurality of user operable chord specification keys;
   detecting means coupled to said keyboard for detecting the key operation state of said chord specification keys;
   first means coupled to said detecting means for generating a first signal representing, when only one of said chord specification keys is operated, said one operated key as a particular key, and for generating a second signal representing the lower or lowest note key as said particular key when plural chord specification keys are operated;
   second means coupled to said detecting means for generating a third signal representing the number of chord specification keys operated at a time by the operator; and
   chord designating means coupled to said first and second means and being responsive to one of said first and second signals for generating a signal representing the root note of a chord to be produced which is a function of said particular key, and being responsive to said third signal for generating a signal representing the type of the chord to be produced as a function of the number of said chord specification keys operated simultaneously, irregardless of which of said plurality of chord specification keys are operated.

10. The key data entry system of claim 9, wherein said chord specification keys exhibit key chattering when operated, and said detecting means includes means for detecting the key operation state of said chord specification keys after the lapse of a predetermined period of time from initial operation of a key, said predetermined period of time at least as long as the key chattering time of said chord specification keys.

11. The key data entry system of claim 9, wherein said chord designating means generates a signal representing a major chord when only one chord specification key is operated, a minor chord when two chord specification keys are operated together, and a seventh chord when three or more chord specification keys are operated together.

12. The key data entry system of claim 9, wherein said chord designating means generates a signal representing a major chord when only one chord specification key is operated, a seventh chord when two chord specification keys are operated together, and a minor chord when three or more chord specification keys are operated together.

13. The key data entry system of claim 9, wherein said chord designating means generates a signal representing a first type of chord when only one chord specification key is operated, and a signal representing a second type of chord when two chord specification keys are operated together.

14. The key data entry system of claim 13, wherein said chord designating means generates a signal representing a third type of chord different from said first and second types of chords when three of said chord specification keys are operated together.

15. The key data entry system of claim 13, wherein said first type of chord is a major chord, and said second type of chord is a minor chord.

16. The key data entry system of claim 13, wherein said first type of chord is a major chord, and said second type of chord is a seventh chord.

* * * * *